United States Patent [19]
Rubey

[11] 3,944,719
[45] Mar. 16, 1976

[54] WIRE ROUTING APPARATUS

[75] Inventor: Ulyss Ray Rubey, Lewisville, Tex.

[73] Assignee: United Wiring and Manufacturing Co., Garland, Tex.

[22] Filed: Jan. 25, 1974

[21] Appl. No.: 436,533

Related U.S. Application Data

[63] Continuation-in-part of Ser. No. 318,589, Dec. 26, 1972, Pat. No. 3,825,999.

[52] U.S. Cl. ............... 174/72 A; 174/68.5; 317/122
[51] Int. Cl.² ..................... H02B 9/00; H05K 1/18
[58] Field of Search ............. 174/68.5, 95, 97, 174, 174/175, 40 CC, 72 A, 164; 248/DIG. 3, 223; 211/87, 60; 317/101 CC, 122; 24/204, 208 A

[56] References Cited
UNITED STATES PATENTS

| | | | |
|---|---|---|---|
| 2,397,801 | 4/1946 | Mitchell | 24/204 |
| 2,764,626 | 9/1956 | Teichroew | 174/174 |
| 3,187,902 | 6/1965 | Nelson | 248/DIG. 3 UX |
| 3,193,231 | 7/1965 | Curry | 248/223 |
| 3,626,086 | 12/1971 | Rubey | 174/72 A X |
| 3,631,300 | 12/1971 | Humble | 317/122 |
| 3,643,133 | 2/1972 | Towell | 174/68.5 X |
| 3,825,999 | 7/1974 | Rubey | 174/72 A X |

FOREIGN PATENTS OR APPLICATIONS

| | | | |
|---|---|---|---|
| 975,405 | 10/1950 | France | 174/175 |
| 1,290,461 | 4/1961 | France | 174/40 CC |

*Primary Examiner*—Darrell L. Clay
*Attorney, Agent, or Firm*—Richards, Harris and Medlock

[57] ABSTRACT

Wire routing guides are used on circuit boards employing solder pads plated onto the reverse side of an insulative board in an orthogonal array and connected to aligned conductive areas on the obverse side by plated-through holes. The wire routing guides, having upstanding fingers, are mounted on the reverse side of the board with conductive pins from electrical components extending through the holes in the board from the obverse side to the reverse side. Insulated wire is threaded around the wire routing guides and pins of the electrical components and guided in accordance with a predetermined pattern of component interconnections. For interconnections between points on the board, wire is threaded substantially orthogonally.

2 Claims, 4 Drawing Figures

WIRE ROUTING APPARATUS

BACKGROUND AND SUMMARY OF THE INVENTION

This is a continuation-in-part of an application Ser. No. 318,589, filed Dec. 26, 1972, now U.S. Pat. No. 3,825,999.

This invention relates to wire routing apparatus for automatic wiring of electrical circuit boards, and more particularly to wire routing apparatus for use with a method of making selective electrical connections between conductive pins of circuit components.

Heretofore various techniques have been proposed for making circuit connections in electrical circuits. In one widely used technique wiring printed circuit boards, circuit elements are mounted on insulative boards and connections are made by soldering leads of the elements to conductive paths plated onto the boards. Circuit paths may be formed on both sides of a board by interconnected plated-through holes in the board. The resulting assembly comprising the board, components mounted on the board and plated circuit connections between the electrical components is typically referred to as a "printed circuit".

Printed circuit techniques have disadvantages. The packaging density of circuit elements is relatively low, so that the number of printed circuit boards required for a given application is not minimized. This results in increased production time and requires large inventories. Perhaps more importantly, the cost of the engineering work involved in making the art work for a printed circuit is relatively high, as are the costs involved in revising the art work should it become necessary to change the printed circuit arrangement.

Another technique employs multi-layer circuit boards. An assembly of two or more printed circuit boards are stacked and circuit connections are then provided between the boards. The high engineering costs involved in preparing original art work for printed circuit boards and in subsequently changing the art work are compounded when multiple boards are used. Further, the yield that can be achieved in manufacturing such systems is low when complex electrical circuits are involved.

Still another approach involves a technique of wire wrapping. Conductive leads extend from circuit components into cantilever conductive sockets of square or rectangular cross-section. Electrical connections are then made to the sockets by spiral wrapping the end segments of individual wires very tightly around the sockets to assure contact at the corners of the socket. This technique requires an inventory of sockets for the electrical components. Where insulated wire is used, it is necessary to prestrip the ends of each wire. These two characteristics of the wire wrapping technique result in a very high unit cost per electrical connection.

In an effort to reduce costs and avoid other disadvantages encountered in the foregoing, electrical components have been attached to conductive areas on a circuit board in accordance with the method described in U.S. Pat. No. 3,626,086 wherein rows of solder pads are plated onto one side of a board. Metal strips with protruding fingers on opposite sides of the strip are positioned between rows of solder pads.

Insulated wire is then strung between solder pads soldering one end of the wire to a pad, passing the wire around and between the fingers and thence to another pad where it is soldered. After all of the connections necessary for a particular assembly have been thus formed, conducting leads of the circuit components are soldered to the pads to complete the assembly.

The present invention relates to apparatus for routing electrical connections to circuit components comprising an improvement over the technique of U.S. Pat. No. 3,626,086. Guide strips having central upstanding guide fingers with opposed downwardly inclined surfaces are mounted on one side of the board. Component leads are inserted into the holes in the board from the side opposite the guide strips. Insulated wire is then passed around the conductive leads and around the guide fingers along predetermined paths. The wires following orthogonal paths are then soldered to pads and wires following diagonal paths are severed to leave desired interconnections in place.

In one application of the present invention, the solder pads are arranged in an othogonal array with the wire guides extending in one direction of the array. Wires which are to remain intact are strung along orthogonal directions, and wires which are to be severed extend angularly.

The wire routing guide maintains a predetermined spaced relationship between wires to be soldered to pads and wires which pass between adjacent guides.

DESCRIPTION OF THE DRAWINGS

A more complete understanding of the invention may be had by referring to the following detailed description when taken in conjunction with the accompanying drawings wherein:

Referring to the drawings, where FIG. 1 illustrates a wire guide 10 which is a unitary structure formed entirely from an insulative material. Guide 10 includes a wide, flat base 12 which is adhesively secured to the reverse side of a circuit board. T-shaped pillars or finger guides 14 extend upwardly from the base 12. Each guide 14 has opposed, outwardly facing, downwardly and inwardly inclined camming surfaces 16. Confronting faces of adjacent guides are parallel and planar. Guide 10 may be made from a plastic extrusion of cross section shown in FIG. 1. The strips are then transversely grooved forming lands and grooves of equal width and spacing corresponding with the spacing between holes in a circuit board to which the guide is attached. With such cross section, wire wrapped around any guide 14 automatically is cammed downwardly toward the base 12.

FIGS. 2 and 3 illustrate an alternate embodiment of the wire guide 10 that includes a flat base 12 formed from an insulative material. Extending upwardly from the flat base 12 is the plurality of substantially T-shaped pillars or finger guides 14 as described with respect to FIG. 1. Extending downwardly from the flat base 12 are mounting pins 13 that are spaced on the base in a longitudinal direction. Each of the mounting pins 13 includes a cylindrical shank portion terminating in a bulbous end having a substantially spherical configuration. The diameter of the bulbous end is greater than the diameter of the cylindrical shaft with the length of the shaft between the base 12 and the bulbous end greater than the thickness dimension of a circuit board to which the guide will be mounted. As explained previously, the guide 10 may be made from a plastic extrusion entirely from an isulative material.

Figure 2:
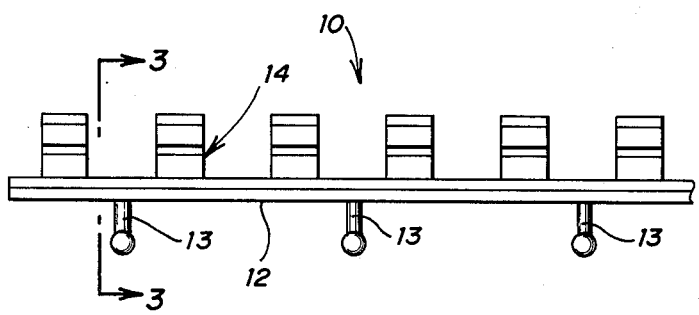
FIG. 2 is a side view of an alternate embodiment of a wire guide member of the invention.
Figure 3:
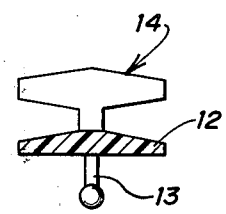
FIG. 3 is a cross section view of the embodiment of the wire guide member of FIG. 2.
Figure 4:
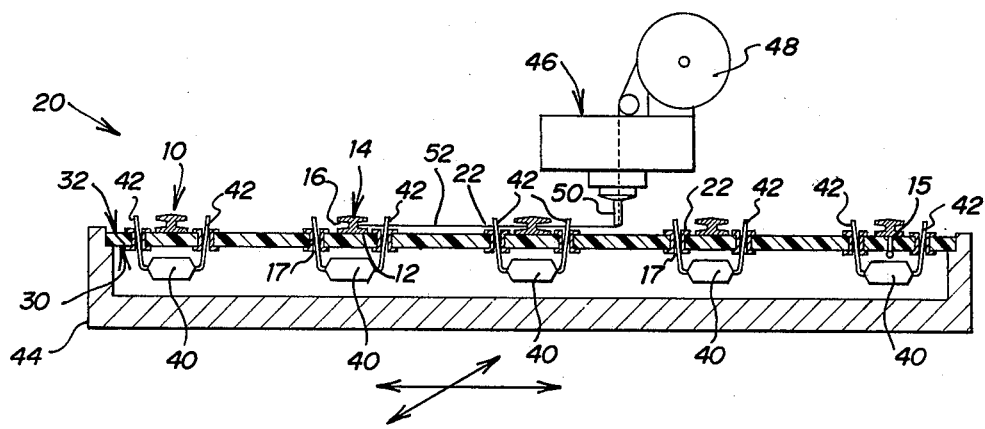
FIG. 4 is a sectional view of a board in a support for automatic wiring.

To utilize the guide of FIGS. 2 and 3, mounting holes are punched or otherwise formed in a circuit board 20 such as indicated by the opening 15 of FIG. 4. These openings are formed in the circuit board 20 between rows of pads 17. The diameter of the openings 15 are larger than the diameter of the cylindrical shaft of the mounting pin 13, but smaller than the diameter of the bulbous end. Before mounting a wire guide 10 on the circuit board 20, the bulbous end is compressed while passing through an opening 15 and expands to its normal dimension to provide a secure mounting of a strip to the board.

Figure 1:
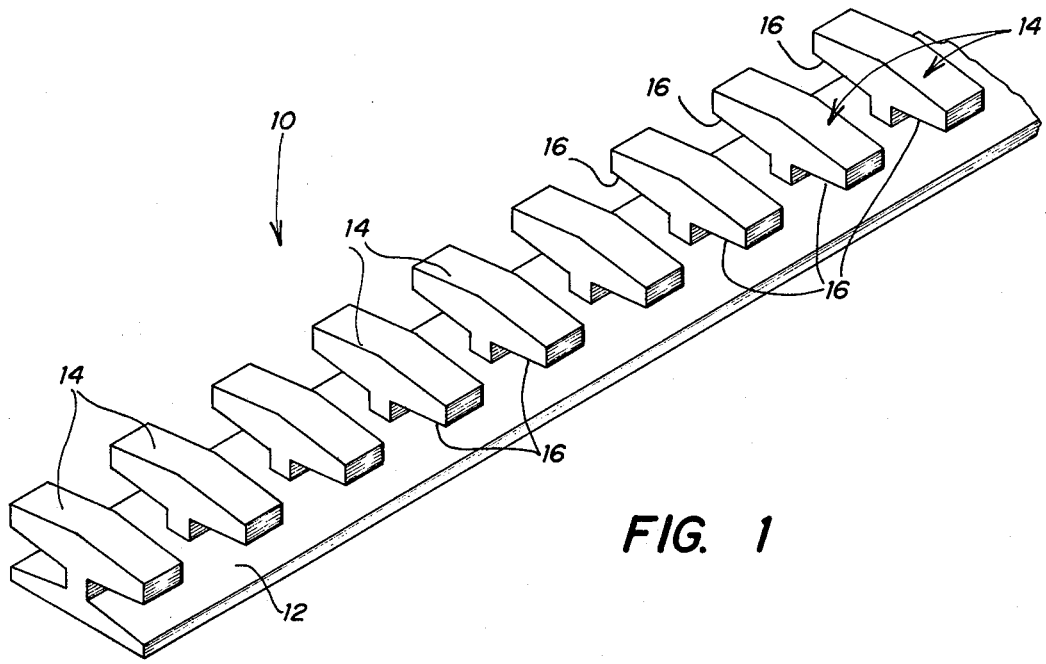
FIG. 1 is a perspective view of a wire guide member in accordance with the invention.

A method of wiring electrical components incorporating the present invention and utilizing the printed circuit board 20 to which guide 10 of FIG. 1 or FIG. 3 is applied is illustrated in FIG. 4. As shown in FIG. 4, four guide strips 10 are secured to the reverse side 32 of a circuit board 20 by conventional means, such as by suitable adhesives. Guides 10 are mounted between rows of pads 22 as shown. The guides 10 are mounted on the surface of alternate ribbons of the conductive bus area.

Component leads are then inserted through the holes 17 from the obverse side 30 to the reverse side 32 thereof. The components may comprise any of the various circuit elements which are commonly utilized in fabricating electronic devices. For example, they may be resistors, capacitors, inductors and other "passive" devices. They may also comprise diodes, transistors, SCR's, and various "active" electrical components. In the form illustrated, the circuit board 20 is designed to accommodate dual in-line integrated circuit packages of the type illustrated in FIG. 4. Components of this type comprise a body 40 which may house various types of active and/or passive circuit elements, with two rows of conductive pins 42 extending from spaced points along the opposite sides of the body 40. They are mounted on board 20 with each pin 42 extending through one of the mounting holes 17. Thus the mounting holes preferably are located to correspond with the positioning of leads on components to be wired. It will be recognized that substantially the entire obverse side 30 of board 20 may be covered with circuit packages, or any lesser number of packages may be mounted on board 20 in accordance with the requirements of a particular application.

After components are mounted, board 20 is positioned on an x-y table 44 (FIG. 4) with the reverse side 32 thereof up and with the obverse side 30 down. A wire feed unit 46 is positioned above the x-y table and is provided with a supply of insulated wire 48. Unit 46 includes a wire capillary 50 for dispensing wire from the supply 48 at a level closely adjacent to side 32 of board 20.

Feed unit 50 and table 44 are operated such that relative movement between them preferably is preprogrammed to drive table 44 along paths such that a continuous wire will be strung to all desired locations on the board in one continuous operation. This operation is indicated in FIG. 4, where wire extends from the supply 48 through capillary 50. It is first connected to a fixed point. Thereafter the x-y table 44 moves under program control or manually to string wire 52 across the reverse side 32 of board 20.

The wire 52 is wrapped around one guide 10 and due to the camming surfaces 16 (FIG. 1) of guide 14, the wire is cammed downwardly toward board 20 during wrapping. This assures that previously installed wire will not obstruct the path of capillary 50 in subsequent wiring operations.

In laying the wire 52, the path thereof is substantially in accordance with the directions of the orthogonal array of solder pads 22 where a single length of wire interconnects two of the pins 42. Typically, a circuit does not comprise a single length of wire connected between various conductive pins. It is necessary to utilize many discrete lengths of wire in order to form all of the connections that are generally necessary.

Since wire 52 is installed as a single length to reach all points of connection, it is necessary to sever wire 52 at various points. As above indicated where a cut is to be made, wire 52 passes from a guide 14, passes preferably twice around pin 42, and then around a different guide 14, causing the wire to extend diagonally rather than orthogonally.

After wire 52 has been installed in all desired locations, a knife holder (not shown) carrying knives moves downward to drive the knives onto the areas between adjacent pads 22. The knives engage only portions of wire which extend diagonally or angularly. By this means the wire is severed at all desired points. Alternatively, one of the knives may be mounted in an x-y unit and moved under program control to locations where wire is to be severed.

Whenever the x-y table moves to string wire 52 angularly, this is followed by wrapping the wire 52 around a pair of fixed edge pins on table 44 located adjacent board 20. By this means, the "tail" remaining after wire 52 is cut by knives is secured to the edge pins and is thereby automatically withdrawn when board 20 is removed from the x-y table.

As above noted, the relative movement between the wire feed unit 46 and table 44 may be carried out manually. Preferably the movements of the x-y table 44 are preprogrammed such as by means of a computer, a numerical control system, or the like. The orthogonal array of the component parts of the printed circuit board and the space between the component parts readily accommodate automatic control of the wiring operation. Production line operations involving many replications of the same board are carried out much more rapidly and accurately than could be done manually.

After knives cut the angularly extending portions of the wire 52, board 20 is removed from the x-y table and is positioned on a second x-y table (not shown) where insulation removal and soldering operation takes place simultaneously. The insulation is of the type which vaporizes at soldering temperature.

Solder connections are formed between wire 52, pads 22, plated-through holes 17 and pins positioned therein. Contact heating, induction heating, laser beam, infrared or microwave heating, all well known, may be utilized individually or in combination to vaporize the insulation and to melt the solder either simultaneously or in two separate steps. The soldering operation may comprise a reflow process utilizing the plating comprising pads 22, or additional solder may be deposited on top of pads 22. In any event, soldering is one step in the wiring operation. Solder connections adjacent to pins 42 projecting through holes 17 electrically interconnect selected pins 42 in accordance with the requirements of a particular wiring operation.

Where it is necessary to thread wire 52 between adjacent guides 10, the wire may pass adjacent to a pad 22 that is to be soldered. In such case, soldering is preferably carried out with the aid of shield members. Such members may actually displace wire 52, but in any event maintain predetermined spaced relationships to pads 22 and affords additional thermal isolation for the wire adjacent a solder location during the soldering operation.

Where all operations are to be carried out on the same x-y table, unit 46 (FIG. 4) may include wire threading apparatus, wire cutting apparatus and soldering apparatus. The cutting operation may be carried out during the threading operation. In such a case the wire is restarted downstream of each cut. This is preferably accomplished by programming unit 46 to wrap the wire two or more times around one of pins 42 followed by additional wire stringing.

From the foregoing it will be understood that the present invention comprises a novel apparatus for routing wiring of electrical components which overcomes the difficulties that have long been associated with the prior art. High costs involved in providing art work for conventional printed circuit board and multi-layer printed circuit board wiring techniques are completely eliminated. Likewise, the costs that are involved in effecting changes in circuitry wired by these techniques are completely eliminated. Rather, in accordance with the present invention a single printed circuit board may be utilized to form any desired wiring pattern by simply changing the programming of a computer or a numerical control wiring system. The use of the invention is also advantageous over wire wrapping techniques. Thus, the sockets that are necessary for use in wire wrapping systems are eliminated. Also, in accordance with the present invention, it is not necessary to prestrip insulated wires in order to carry out the wiring operation.

Other advantages are also obtained by use of the present invention. Thus, electrical components, particularly integrated circuit packages, may be mounted in a printed circuit board and wiring connections formed directly to pins thereof. Alternatively, pins can be mounted in the circuit board and wiring connections formed to such pins, whereupon pins of I.C. packages or other components may be soldered to the opposite side of the board without danger of unsoldering either the pins or soldered wire connections on the reverse side of the board. Similar techniques may be utilized to replace defective in-line packages or other components without danger of disrupting the wiring connections.

Although particular embodiments of the invention have been illustrated in the drawings and described in the foregoing detailed description, it will be understood that the invention is not limited to the embodiments disclosed, but is capable of numerous rearrangements, modifications, and substitutions of parts and elements without departing from the spirit of the invention.

What is claimed is:

1. Wire routing apparatus for mounting on a circuit board supporting interconnected electrical components, comprising:
   a base having an elongated substantially rectangular configuration,
   a plurality of substantially T-shaped fingers extending upwardly from said base and spaced thereon in a longitudinal direction, each of the plurality of fingers comprisng:
   a. a pillar extending upwardly from said base,
   b. a cross bar having a substantially rectangular configuration with its longitudinal axis transverse to the longitudinal direction of said base and extending from said pillar, and
   c. opposed camming surfaces extending from said pillar to said cross bar and facing outwardly from said pillar transverse to the longitudinal direction of the base, said surfaces inclining inwardly to the pillar from said cross bar and facing downwardly.

2. Wire routing apparatus for mounting on a circuit board as set forth in claim 1 wherein the confronting faces of adjacent fingers are parallel and planar.

* * * * *